(12) United States Patent
Covasala

(10) Patent No.: US 9,140,760 B2
(45) Date of Patent: Sep. 22, 2015

(54) RESISTANCE MEASUREMENT FOR BATTERY CELLS

(71) Applicant: Flextronics International Kft., Tab (HU)

(72) Inventor: Alexander Covasala, Esslingen (DE)

(73) Assignee: Flextronics AP, LLC, Broomfield, CO (US)

( * ) Notice: Subject to any disclaimer, the term of this patent is extended or adjusted under 35 U.S.C. 154(b) by 114 days.

(21) Appl. No.: 13/768,951

(22) Filed: Feb. 15, 2013

(65) Prior Publication Data

US 2013/0241568 A1    Sep. 19, 2013

(30) Foreign Application Priority Data

Feb. 15, 2012  (EP) .................................. 12155490

(51) Int. Cl.
   *G01R 31/36* (2006.01)
   *G01R 31/02* (2006.01)

(52) U.S. Cl.
   CPC ........ *G01R 31/3627* (2013.01); *G01R 31/3631* (2013.01); *G01R 31/3662* (2013.01); *G01R 31/028* (2013.01); *G01R 31/3624* (2013.01)

(58) Field of Classification Search
   CPC ... H01J 1/00; G01R 31/3658; G01R 31/3651; G01R 31/3662
   USPC ................ 324/429, 421, 525, 691, 430, 426
   See application file for complete search history.

(56) References Cited

U.S. PATENT DOCUMENTS

| | | | |
|---|---|---|---|
| 5,126,675 A * | 6/1992 | Yang | 324/435 |
| 7,709,977 B2 * | 5/2010 | Jansen et al. | 307/87 |
| 2010/0324847 A1 * | 12/2010 | Yen | 702/63 |
| 2011/0291611 A1 * | 12/2011 | Manor | 320/107 |
| 2011/0304339 A1 * | 12/2011 | Schumacher et al. | 324/509 |
| 2012/0292993 A1 * | 11/2012 | Mettler et al. | 307/25 |

* cited by examiner

*Primary Examiner* — Tung X Nguyen
*Assistant Examiner* — Alesa Allgood
(74) *Attorney, Agent, or Firm* — Haverstock & Owens LLP

(57) ABSTRACT

A power supply is disclosed that is configured for installation in a motor vehicle. The power supply comprises an energy source and a system for accurately measuring the internal resistance of the energy source during the operation of the power supply, without a distortion that would normally result from discharge of the energy storage device.

10 Claims, 2 Drawing Sheets

When closing the switch the voltage source is short circuited via the capacitor.

When closing the switch the voltage source is short circuited via the capacitor.

RESISTANCE MEASUREMENT FOR BATTERY CELLS

RELATED APPLICATIONS

This Application claims priority under 35 U.S.C. §119(a) through (d) of the European Patent Application No. EP 12 155 490.1 filed Feb. 15, 2012, which is hereby incorporated by reference in its entirety.

FIELD OF THE INVENTION

The present invention relates to a device for measuring resistance in a voltage source. More specifically, the present invention relates to measuring the internal voltage of an energy storage device.

BACKGROUND OF THE INVENTION

Resistance measuring devices are known in principle. They are used to measure the internal resistance of energy storage, such as the vehicle battery in a vehicle electrical system of a motor vehicle. A functional check of such energy storage in a motor vehicle is customarily checked by the internal resistance of the energy storage. Checking the internal resistance of the energy storage may cause a malfunction, particularly due to damaged cables or the like, to determine if the internal resistance of the respective energy storage falls below the permissible limits, on or off. Especially in a start/stop system in motorized vehicles and in the required personal electrical system stabilization, the measurement of the internal resistance of energy storage is particularly important. Leaving the internal resistance of an energy storage below a prescribed limit may cause a shutdown of the start/stop system. The energy storage devices to be tested may be fixed or may also be replaceable energy storage. The necessary internal resistance measurement is for voltage sources, such as supercapacitors CAP or conventional automotive batteries.

Particularly for the latest generation of batteries and supercapacitors, the internal resistance measurement is problematic because these energy storage devices are designed for very high power density and are set for the lowest possible internal resistance. With an energy storage device which has a very low internal resistance, however, a large current flow is necessary to produce an appreciable voltage drop. To generate a voltage drop of 0.5 volts (V) to a voltage source with an internal resistance of 1 mega-ohm (MΩ), for example, a flow of current of 500 amperes (A) is required. The low-impedance design of energy storage devices accordingly compels the resistance measurement in the MΩ range requiring costly and high-precision measuring instruments.

A further problem is that the measurement of the internal resistance of the energy storage device during the operation of a connected energy consuming device needs to be accurate. A particularly steep current ramp is needed to enable a reliable internal resistance measurement. In order that the discharge of the energy storage device is not measured, the current pulse must be turned on as "hard" and also be turned off "soft" to avoid voltage spikes (load dump) by a sudden current break.

SUMMARY OF THE INVENTION

An object of the present invention is therefore to provide a resistance measuring device for measuring the internal resistance of an energy storage device, which can be used flexibly and reliably. Even in low-designed energy storage devices the internal resistance of the energy storage is measured without a distortion that results from the discharge of the energy storage device.

To solve the above-mentioned object, a resistance measuring device having the features of claim 1 is proposed. The resistance measuring device is used for the load-independent measurement of the internal resistance of an energy storage device, in particular in an electrical system of a motor vehicle. The resistance measuring device comprises an energy storage device coupling in parallel to a component and a switch that is configured to generate a current pulse by switchably coupling a current measuring resistor to the component, and a measuring device configured to measure a voltage drop $\Delta U$ of the energy storage device and to measure a current difference $\Delta i$ across the current measuring resistor.

An essential point of the invention lies in the fact that the resistance measuring device according to the invention, the measurement of the internal resistance of an energy storage device is independent of the connected load. Here, the time of measurement can be arbitrarily chosen in an advantageous manner. By an additional component, which is connectable in parallel to the energy storage device by means of a switching element, a defined even decaying current pulse can be produced which meets the requirement for one of a "hard" power-up and a "soft" switching-off. In this way it is avoided that the discharging of the energy storage device is included in the calculation of the internal resistance of the energy storage device that would otherwise be mistakenly included with calculation of the internal resistance and lead to undesired voltage increases.

Particularly preferred is a resistance measuring device, wherein the (passive) component is formed as a storage element, in particular in the form of a capacitor, preferably an electrolytic capacitor (capacitor). It is understood that, in principle, other devices may be generated to produce the even decaying current pulse, as long as they ensure a "hard" switching on and a "soft" switching off of the current pulse. The length of the current pulse, resulting in a closing of the switching element, and by the generated short circuit between the energy storage device and the resistance measuring device, depends on the total resistance of the circuit and the capacitance of the parallel component, provided that it is formed as a capacitor. The switching element is advantageously designed as a MOSFET. There could also be other types of switching elements. Preferably the switching element is actuated only when an internal resistance measurement of the energy storage device is to be performed. The switching element thus preferably only functions to enable the implementation of an internal resistance measurement of the energy storage device.

The internal resistance measuring device is preferably connected via measuring lines to the energy storage device, and has, in particular a microprocessor for calculation of the internal resistance of the energy storage device. The internal resistance is calculated here by the voltage drop detected at the energy storage device and by a power differential. The difference in current can be detected by a current measuring resistor, which is preferably switched between the component and the energy storage device. In addition, a discharge resistor may be connected in parallel to the component.

To solve the above-mentioned object, a power supply device, in particular in an on-board system of a motor vehicle, having the features of claim 11 is proposed. The power supply device comprises an energy storage device, and a resistance measuring device of the invention. The energy storage device may comprise one or more energy storage elements, in particular in the form of so-called supercap capacitor, which are sufficiently known from the prior art.

As said, it is particularly advantageous when the resistance measuring device is not integrated into the load path of the energy storage device, but independently thereof arranged as a modular separate element, so that a permanent current flow is avoided in the resistance measuring device. This significantly reduces the power dissipation in the resistance measuring device. Furthermore, there is a low loading of the energy storage device through the measuring resistance measuring device of the present invention. A current break, i.e. an abrupt end of the current flow, can be avoided when switching off the measuring current pulse. Voltage spikes can be avoided entirely. It is also apparent, the present invention has the advantage that only a small component effort is necessary.

BRIEF DESCRIPTION OF THE DRAWINGS

The invention is explained in more detail with reference to the following figures.

DETAILED DESCRIPTION OF THE DRAWINGS

Figure 1:
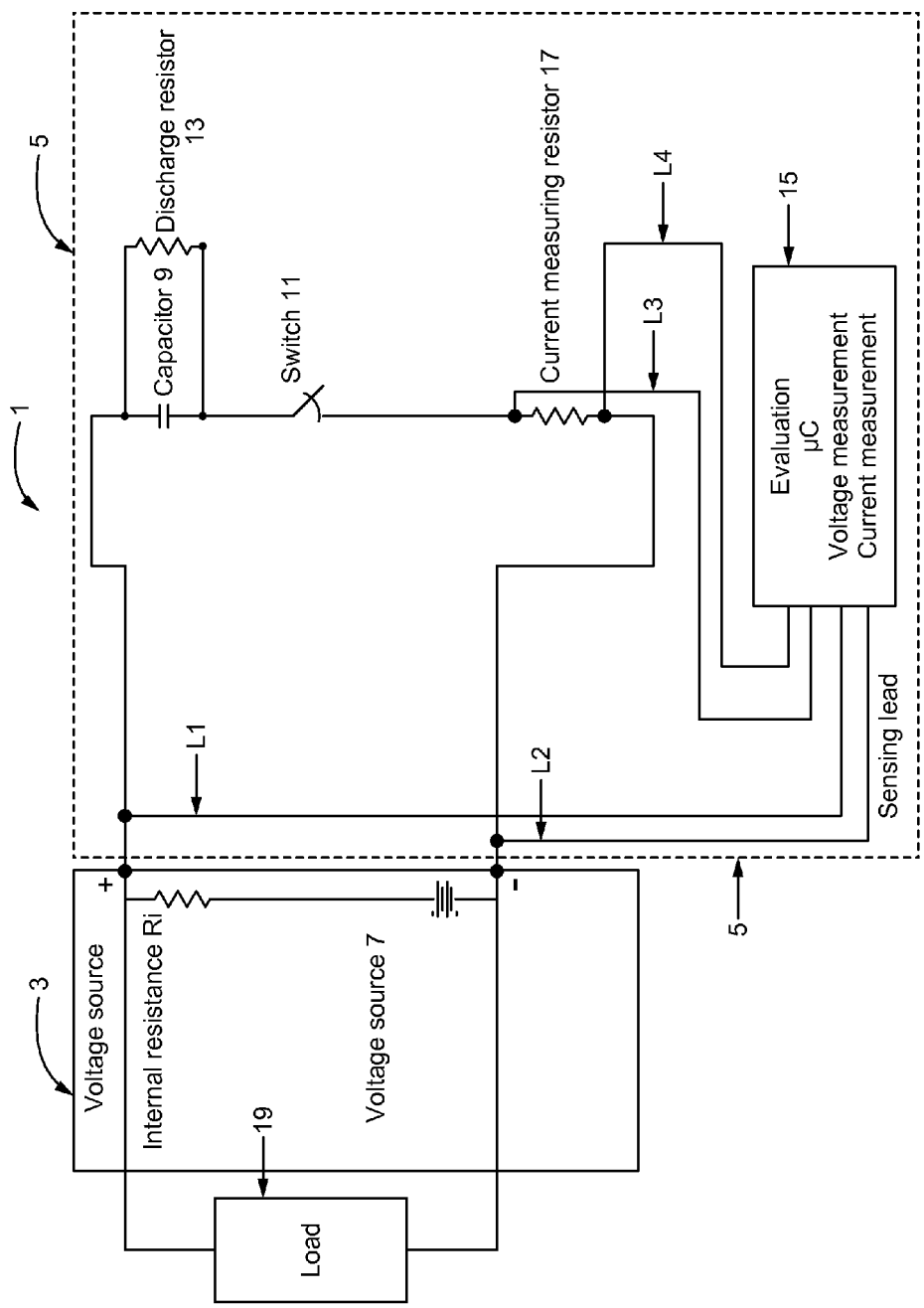
FIG. 1 shows a schematic block diagram of a power supply device with an energy storage device and a resistance measuring device according to some embodiments.

FIG. 1 shows a schematic representation of a power supply device 1 with an energy storage device 3 and a resistance measuring device 5 of the invention. The energy storage device 3 may consist of one or more energy storage elements, such as capacitors, or the like from multiple supercap energy storage elements. Alternatively, it may also be a conventional automotive battery or a like energy storage.

The energy storage device 3 of FIG. 1 has an internal resistance Ri, and a voltage source 7, which may be connected via terminals to a load 19 (e.g. the electrical system of a motor vehicle). The resistance measuring device 5 is connected to the energy storage device 3. Preferably, the resistance measuring device 5 is not in the power path of the energy storage device 3 integrated into the on-board network, but is instead separate from the power path of the energy storage device 3. In this way a constant flow of current through the resistance measuring device 5 is avoided.

The resistance measuring device 5 comprises a preferably passive component 9, which is formed according to the embodiment of FIG. 1 as a capacitor 9, and in particular as an electrolyte capacitor (electrolytic capacitor). The passive component 9 is arranged in parallel with the energy store 3. Between the energy storage device 3 and the component 9, a switching element 11 is provided. Using the switching element 11, the energy storage device 3 can be short-circuited with the passive component 9 and a parallel discharge resistor 13.

The resistance measuring device 5 comprises a measuring device 15 that is coupled to measurement lines L1, L2 and L3, L4. The measuring device 15 is used to measure a voltage drop $\Delta U$. To measure $\Delta U$, the measurement lines L1 and L2 are connected to the energy storage device 3. The voltage drop $\Delta U$ across the energy storage device 3 can be measured more accurately when the leads L1 and L2 are mounted as close as possible to the terminals "+pole" and "−pole". The same applies to the current measurement in which a voltage is also to be measured as accurately as possible. The measuring device 15 measures a current difference $\Delta i$. The measuring device 15 is connected via measurement lines L3 and L4 with a current measuring resistor 17 which is connected between the energy storage device 3. L3 and L4 are arranged as close as possible to the current sensing resistor 17 to detect the voltage drop across the current sensing resistor 17 with a high accuracy. When the switching element 11 is closed, therefore, a current of the energy storage device 3 via the current measuring resistor 17 flows to the component 9. This current flow is detected by the current measuring resistor 17 and passed via the measurement lines L3 and L4 to the measuring device 15 to measure $\Delta i$ across the measuring resister 17.

The measuring device 15 preferably includes a microprocessor which on the basis of the detected $\Delta U$ voltage drop and the detected current difference $\Delta i$ computes the internal resistance of the energy storage device 3 according to the formula $Ri=\Delta U/\Delta i$.

The operation of the resistance measuring device 5 according to the invention according to the invention is as follows:

A measurement of the internal resistance Ri of the energy storage device 3 can occur at any time regardless of a connected load. For this purpose, the switching element 11 is closed so that the energy storage device 3 is shorted via the component 9. Provided that the component 9, as shown in FIG. 1, is designed as a capacitor, the voltage applied to produce the capacitor voltage U produces an evenly decaying current pulse. The electrical behavior of a capacitor in the DC circuit, when a voltage is well known and will therefore not be further elaborated. It is only important that the connection of the capacitor 9 to the energy storage device 3 generates a current pulse with a decaying current curve that can be used for the internal resistance measurement. Such a resultant curve of the voltage U at the energy storage device 3 and the current I between the energy storage device 3 and the component 9 is shown schematically in FIG. 2. The time t0 indicates the time of operation of the switching element 11, so if the energy storage device 3 is short-circuited to the component 9 the current at t0 is 0. The current I at t0 is not computed since I is in the denominator of the computation Ri=U/I and would generate a "divide by zero" error.

Figure 2:
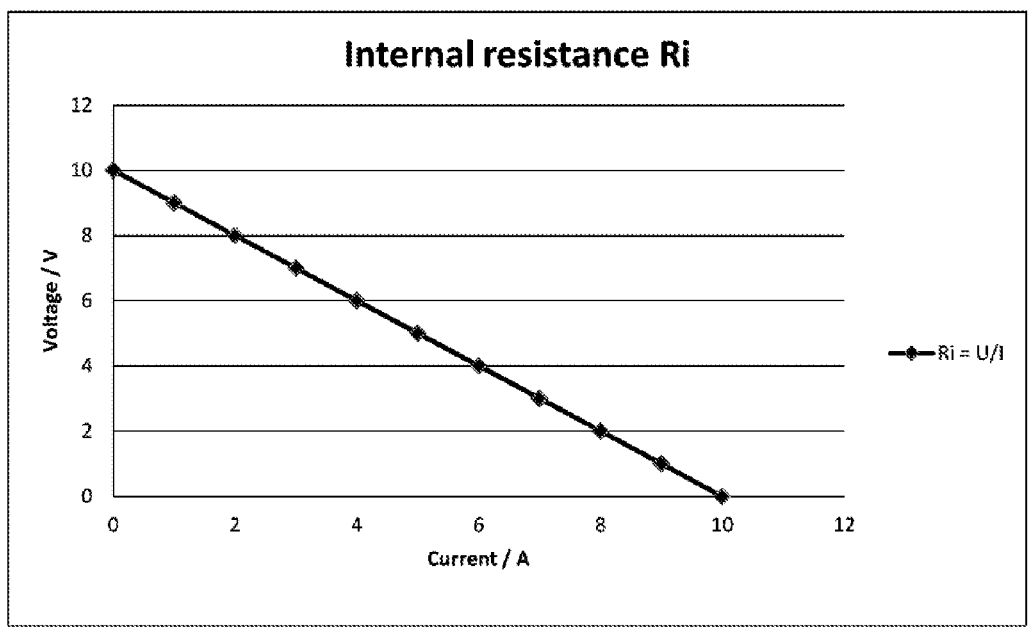
FIG. 2 shows a schematic curve of the current and voltage differences in the implementation of an inventive internal resistance measuring device of an energy storage device.

FIG. 2 shows that the voltage U on the parallel-connected component 9 continuously increases, resulting from the charging of the capacitor. The flow of current I on the other hand continues to decline. The more charge is transported, therefore, the greater the voltage U across the component 9. According to Ohm's law the current I will consequently decrease. In this way, current chopping is avoided, which would lead to an undesirable increase in voltage U (load dump). From the measurement of the voltage drop $\Delta U$ and a corresponding $\Delta i$ current difference, the internal resistance Ri of the energy storage device 3 is determined.

It is thus that the resistance measuring device 5 according to the invention in a simple manner allows a load-independent internal resistance measuring device 5 of an energy storage device 3. This is particularly accomplished by the fact that the component 9 is formed as capacitor naturally generates a defined current pulse when the switching element 11 is closed.

The component costs of such a circuit is small and produces only a low power loss. Furthermore, the loading of the energy storage device 3 by the resistance measurement device 5 can be kept low in accordance with the present invention.

In the current measuring device 5 of the present invention, the current flow is thus not through a connected load, but instead is by switching on an additional component 9 to the energy storage device 3 connected in parallel which produces the results shown in FIG. 2, and an evenly decaying current pulse. A passive component 9, which can produce this effect, of course, is the capacitor. Basically, however, other components, in particular active components are used, which have such an advantageous behavior.

The disadvantages of the prior art are thus avoided by the invention by applying a current and thus a load even decaying free cut-off is ensured in the internal resistance measuring means. Thus, even energy storage, especially batteries or supercapacitors with high power density are reliably verified on their internal resistance stood out. Incidentally, the resistance measuring device 5 can be used flexibly according to the present invention and in particular as an additional, retrofittable modular component with an existing energy storage device 3 in the formation of an inventive power supply device 1 can be connected.

REFERENCE LIST 1 power supply device
3 energy storage device
5 resistance measuring device
7 voltage source
9 component
11 switching element
13 discharge resistor
15 measuring device
17 current measuring resistor
Ri internal resistance
L1 test lead
L2 test lead
L3 test lead
L4 test lead
U voltage
I Power
ΔU voltage drop
Δi current difference

What is claimed is:

1. A resistance measuring device for the load-independent measurement of the internal resistance (Ri) of an energy storage device, in particular in an electrical system of a motor vehicle, comprises:
   an energy storage device coupled with an electrical system of a motor vehicle such that the energy storage device provides power to the electrical system along a power path from the energy storage device through the electrical system;
   a measuring circuit coupled in parallel with the energy storage device outside of the power path and comprising a component, a switch and a current measuring resistor coupled together in series, wherein the measuring circuit is configured to generate a current pulse by switchably electrically coupling the current measuring resistor to the component via closing the switch; and
   a measuring device coupled to positive and negative poles of the energy storage device and configured to measure a voltage drop (ΔU) of the energy storage device between the positive pole and the negative pole and to measure a current difference (Δi) across the current measuring resistor, wherein the component comprises a passive energy storage element, in particular as a capacitor.

2. The resistance measuring device of claim 1, wherein the capacitor comprises an electrolytic capacitor.

3. The resistance measuring device of claim 1, wherein the length of the current pulse generated coupling the current measuring resistor to the component is determined from the total resistance of a circuit comprising the energy storage device, the component, the switch, and the current measuring resistor, and the capacitance of the component.

4. The resistance measuring device of claim 1, wherein the switch comprises a MOSFET.

5. The resistance measuring device of claim 1, wherein the measuring device further comprises a microprocessor configured to determine the internal resistance (Ri) of the energy storage device.

6. The resistance measuring device of claim 1, wherein the switch is positioned between the component and the current measuring resistor.

7. The resistance measuring device of claim 1, wherein the measurement of Ri is carried out independently of a load produced by the electrical system of the motor vehicle.

8. The resistance measuring device of claim 1, further comprising a discharge resistor coupled in parallel with the component.

9. A motor vehicle comprising:
   an electrical system;
   an energy storage device coupled with the electrical system such that the energy storage device provides power to the electrical system along a power path from the energy storage device through the electrical system; and
   a measuring circuit coupled in parallel with the energy storage device outside of the power path, wherein the measuring circuit comprises a capacitor, a switch and a current measuring resistor coupled together in series and a discharge resistor coupled in parallel with the capacitor, wherein the measuring circuit is configured to generate a current pulse by switchably electrically coupling the current measuring resistor to the capacitor via closing the switch; and
   a measuring device directly coupled to positive and negative poles of the energy storage device and configured to measure a voltage drop (ΔU) of the energy storage device between the positive pole and the negative pole and to measure a current difference (Δi) across the current measuring resistor.

10. A power supply according to claim 9, wherein the energy storage device comprises at least one supercap capacitor.

* * * * *